(12) United States Patent
Benedix et al.

(10) Patent No.: US 6,738,304 B2
(45) Date of Patent: May 18, 2004

(54) DYNAMIC MEMORY DEVICE AND METHOD FOR CONTROLLING SUCH A DEVICE

(75) Inventors: Alexander Benedix, Munich (DE); Stefan Dankowski, Munich (DE); Reinhard Dueregger, Poing (DE); Wolfgang Ruf, Friedberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/283,992

(22) Filed: Oct. 30, 2002

(65) Prior Publication Data

US 2003/0086311 A1 May 8, 2003

(30) Foreign Application Priority Data

Nov. 8, 2001 (DE) .......................... 101 54 770

(51) Int. Cl.⁷ ................................ G11C 7/00
(52) U.S. Cl. .................. 365/222; 365/230.06
(58) Field of Search ............. 365/222, 230.06

(56) References Cited

U.S. PATENT DOCUMENTS

| | | | |
|---|---|---|---|
| 5,239,505 A | * 8/1993 | Fazio et al. | 365/185.11 |
| 5,535,169 A | * 7/1996 | Endo et al. | 365/230.03 |
| 5,644,544 A | * 7/1997 | Mizukami | 365/222 |
| 6,167,484 A | * 12/2000 | Boyer et al. | 711/106 |

FOREIGN PATENT DOCUMENTS

DE      101 43 766      4/2003

OTHER PUBLICATIONS

Ohsawa et al., "Optimizing the DRAM Refresh Count for Merged DRAM/Logic LSIs," p. 82–87, (1998).
Kim et al., "Block–Based Multi–Period Refresh for Energy Efficient Dynamic Memory," IEEE (USA), p. 193–197, (2001).
Takase et al., "A 1.6–GByte/s DRAM with Flexible Mapping Redundancy Technique and Additional Refresh Scheme," IEEE Journal of Solid–State Circuits (USA), vol. 34 (No. 11), (1999).
Christoph et al., "Schnellerer Zugriff zum Arbeitsspeicher," Elektronik, p. 65–67, (1984).

* cited by examiner

Primary Examiner—M. Tran
(74) Attorney, Agent, or Firm—Jenkins, Wilson & Taylor, P.A.

(57) ABSTRACT

According to one embodiment, a dynamic memory is provided. The dynamic memory can include a memory matrix having a plurality of memory cells arranged in rows and columns. The memory cells in a row can be connected by in each case one of a plurality of word lines. The memory cells in a column can be connected by in each case one of a plurality of bit lines. The dynamic memory can also include a sense amplifier for reading data from the memory cells via the plurality of bit lines. Further, the dynamic memory can include a row address decoder and a column address decoder for generating memory-internal address in a manner dependent on a memory-external address signal. The dynamic memory can also include a sequence control device for cyclically generating refresh addresses for carrying for carrying out a refresh operation of the memory cells.

10 Claims, 5 Drawing Sheets

DYNAMIC MEMORY DEVICE AND METHOD FOR CONTROLLING SUCH A DEVICE

TECHNICAL FIELD

The invention relates to dynamic memories according to the preamble of claim 1 and a method for refreshing the content of such a dynamic memory according to the preamble of claim 6.

BACKGROUND ART

Hitherto, the rising current consumption of ever larger memories has been covered by correspondingly larger current supplies. In order to counteract the evolution of heat and the energy consumption—particularly in the case of portable devices—special power-down modes, etc. are employed. If the memory is not currently being accessed, unrequired functions are turned off, and the current supply is correspondingly reduced.

Such a semiconductor memory is known e.g. from U.S. Pat. No. 6,172,928, in which, in the course of the refresh operation, a first current supply supplies the elements of the memory in the normal operating mode, but not in the power-reduced operating mode. In the course of the refresh operation, a second current supply supplies the elements of the memory in the power-reduced operating mode, but not in the normal operating mode.

The disadvantage with this prior art is that the circuit becomes more costly and more complex due to the second current supply and its control.

SUMMARY OF THE INVENTION

It is an object of the invention to reduce the power loss of a memory system in operation with a minimal outlay on circuitry.

This object is achieved according to the invention by means of a dynamic memory device according to claim 1 and by means of a method for controlling such a dynamic memory device according to claim 6. The subclaims relate to preferred embodiments of the invention.

During the operation of a data processing system with dynamic memories, it is generally the case that only a part of at least one dynamic memory is occupied. However, in the prior art, the dynamic memory is always refreshed in its entirety at predetermined time intervals. According to the invention, by contrast, the rows and/or columns of a memory which are not occupied with values are masked out by selective measures during the refresh. The masked-out rows and/or columns are then not refreshed either in the case of autorefresh commands or in the self-refresh mode. In other words, an insertion and masking-out possibility of rows and/or columns of a memory at the operating time of the system is introduced which is determined by the actually occupied memory locations and is thus virtually user-programmable.

Accordingly, the dynamic memory device having at least one memory matrix having a plurality of memory cells arranged in rows and columns, the memory cells in a row being connected by in each case one of a plurality of word lines and the memory cells in a column being connected by in each case one of a plurality of bit lines, at least one sense amplifier for reading data from the memory cells via the plurality of bit lines, at least one row address decoder and at least one column address decoder for generating a memory-internal address in a manner dependent on a memory-external address signal, a sequence control device for cyclically generating refresh addresses for carrying out a refresh operation of the memory cells, is characterized by a selection device for selectively skipping addresses of memory cells which are not occupied, during the cyclic generation of the plurality of refresh addresses.

In particular, in the dynamic memory device, the selection device comprises an address generator for generating a refresh address, an address register, in which unoccupied memory addresses are stored, and a logic circuit, which outputs a masking-out signal when an address generated by the address generator corresponds to an address stored in the address register, so that the address generator directly generates a further refresh address.

Depending on the application and implementation of the invention, row addresses or column addresses can be stored in the address register.

In a dynamic memory device in which the memory cells are distributed between a plurality of memory banks, each memory bank comprising a sense amplifier for reading data from the memory cells via the plurality of bit lines and a row address decoder and a column address decoder for generating a memory-internal address in a manner dependent on a memory-external address signal, the selection device for selectively skipping addresses during the cyclic generation of the plurality of refresh addresses of memory cells in the respective memory bank which are not occupied is distributed between the plurality of memory banks.

The method according to the invention for refreshing a memory content of such a dynamic memory device is characterized by selective skipping of addresses of memory cells which are not occupied, during the cyclic generation of the plurality of refresh addresses, by a selection device.

Generally, in the case of the method, the refresh operations of the memory cells can be carried out in a burst mode, a cycle stealing mode or in a hidden refresh mode.

One advantage of the invention is that the availability of the memory is increased through the reduction of the cells to be refreshed and thus of the total refresh duration.

Further features and advantages of the invention emerge from the following description of preferred embodiments, in which reference is made to the accompanying drawings.

DETAILED DESCRIPTION OF THE INVENTION

Figure 1:
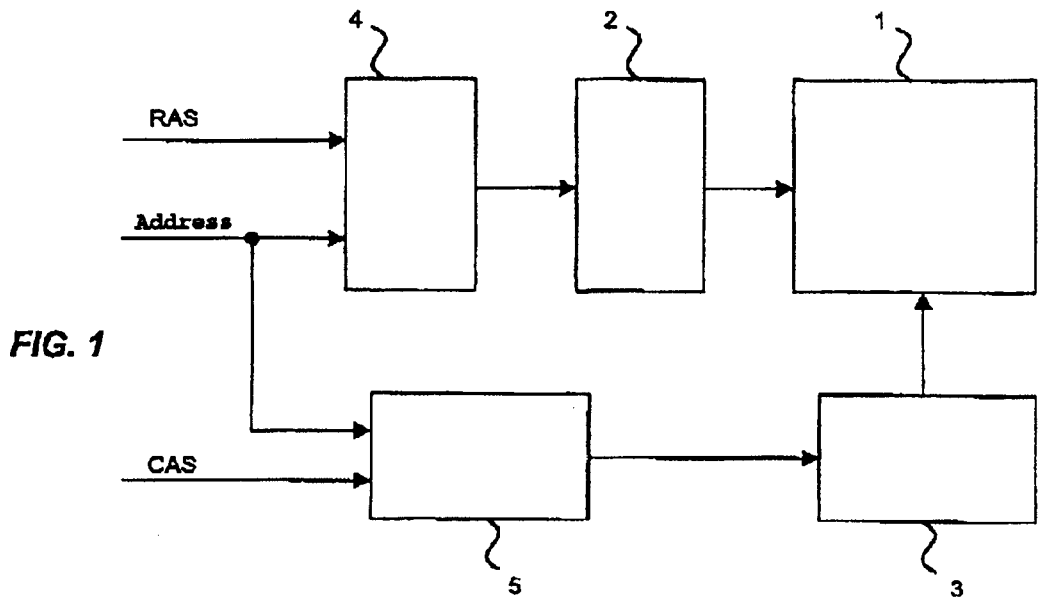
FIG. 1 shows a block diagram for elucidating the address decoding in a dynamic memory according to the prior art.

FIG. 1 shows an address decoder of a memory matrix 1 having a plurality of memory cells (not specifically illustrated). For writing to or reading from one or a plurality of cells in the memory matrix 1, address signals are applied to the memory matrix 1. The address signals are provided by a row decoder 2 and a column decoder 3 in a manner dependent on an external address signal (designated by "address" in FIG. 1).

In order to save connections, in dynamic memories this address is generally input and buffer-stored in two steps. To that end, in a first step, the lower address bits with an RAS (row address strobe) signal are loaded into a row address latch 4, and in a second step, the upper address bits with a CAS (column address strobe) signal are loaded into a column address latch 5.

Figure 2:
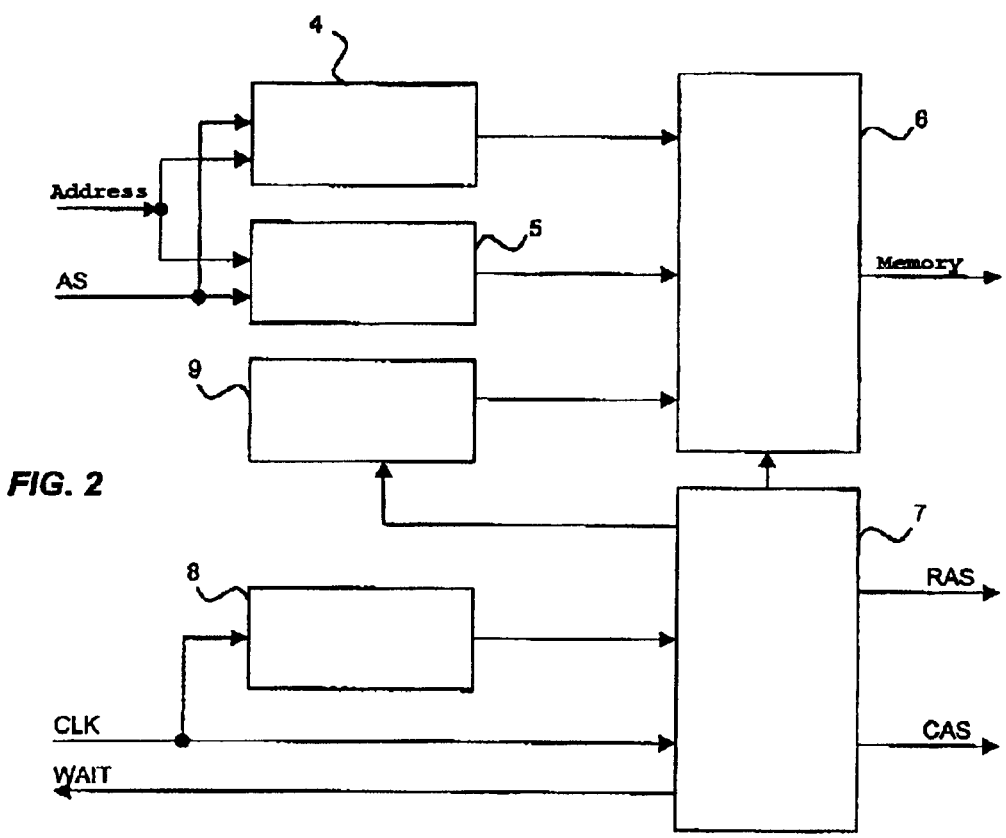
FIG. 2 diagrammatically shows the construction of a control device for a dynamic memory according to the prior art.

Since dynamic memory devices can only retain the stored values for a specific time, it is necessary to call up all the row addresses at least once within (normally) 8 ms. If the memory content is not read out cyclically, circuits are required which effect a cyclic addressing between the normal memory accesses, so-called "dynamic RAM controller". Such a RAM (random access memory) controller is illustrated in FIG. 2.

During a normal memory access, the externally applied address is stored in the row address latch 4 or column address latch 5 if the address strobe signal AS indicates that the address is valid. At the same time, in a sequence control device 6, an access cycle is initiated in which firstly the row address is output via a multiplexer 7 to the memory matrix 1. Afterward, the row address strobe signal causes the row address to be accepted into the memory 1. The same is carried out with the column address strobe signal.

In order to carry out a refresh operation, all the row addresses must be present once e.g. in 8 ms and the refresh must be carried out. The refresh operations are initiated by a refresh time base 8 which—for its part driven by the system clock signal CLK—outputs a signal to the sequence control device at predetermined time intervals. In the case of a particular type of refresh operations explained further below, a refresh counter 9 outputs the present ordinal number of the refresh operation to the multiplexer 7.

To carry out refresh operations, it is necessary in each case to activate a plurality of switching elements of the memory with correspondingly negative consequences with regard to evolution of heat and current consumption. According to the invention, the number of refresh operations in a memory is optimized and the current consumption is thus lowered by only refreshing the cells which are actually used by the system. By contrast, the content of the memory cells in the memory matrix 1 which are not required by the system is not refreshed. To that end, a device is provided in the memory, which device is explained below using exemplary embodiments which are illustrated in FIGS. 3A, 3B, 4 and 5.

Figure 3A:
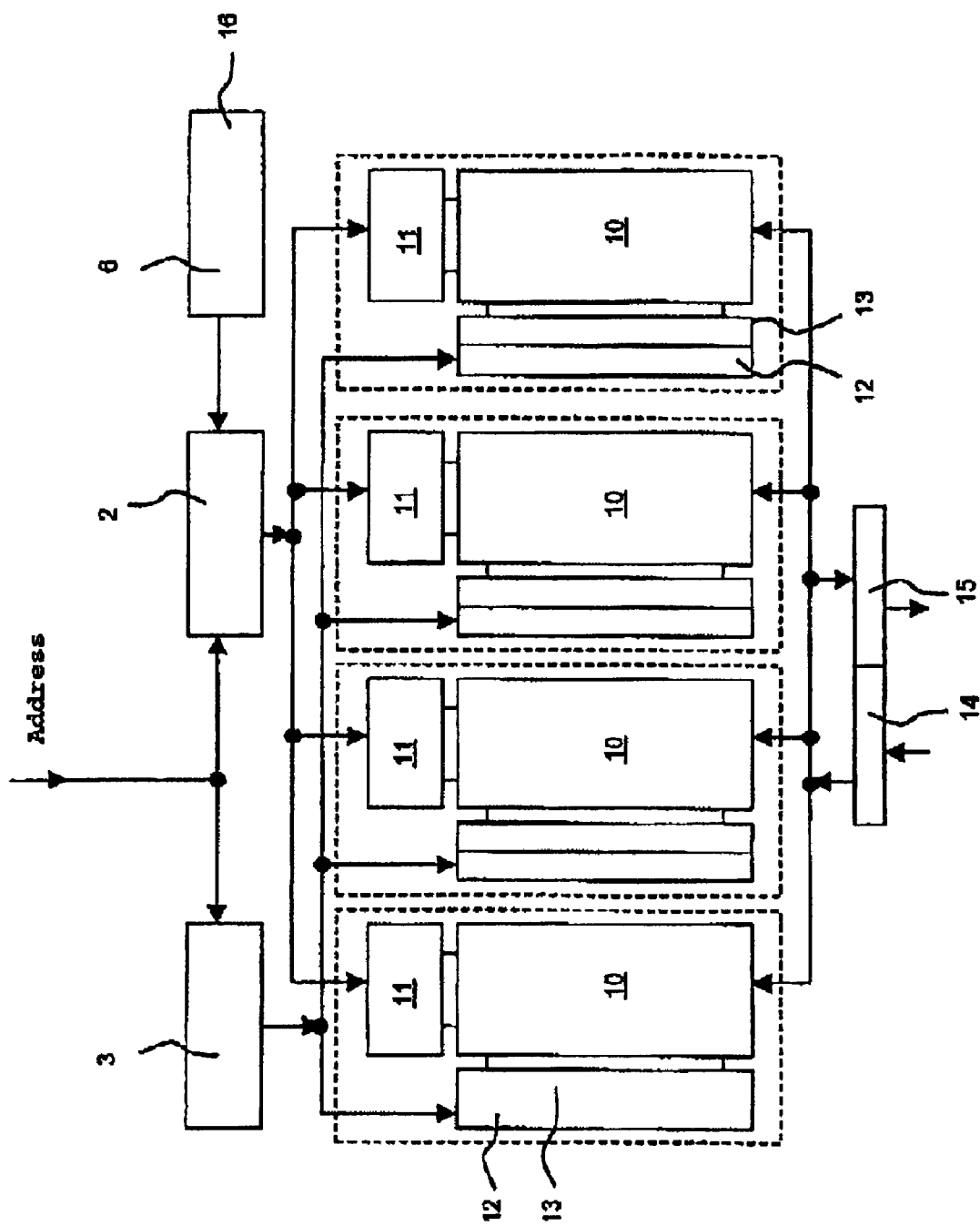
FIGS. 3A and 3B diagrammatically show a first embodiment of the invention and, respectively, a partial region of the embodiment according to FIG. 3A.

FIG. 3A shows a memory which is subdivided into four banks. In this case, each bank contains a predetermined part of the memory matrix 1 with corresponding drive circuits. Each bank in the memory component is bounded by a dashed rectangle. Examples of multiply divided DRAM memories are DRAM components which are subdivided into four banks respectively having 8 Mbit×4 memory space and respectively having 4 Mbit×8 or having 2 Mbit×16 memory space. In FIGS. 3A, 3B, 4 and 5, the memory area in a memory bank is designated by 10. Each of these banks comprises a dedicated row decoder 11 and a dedicated column decoder 12, via which the system accesses the respective bank. The data of a bank are read out via a sense amplifier 13. The row decoder 11 and column decoder 12 of each memory bank are driven by the common row decoder 2 and common column decoder 3, respectively, of the dynamic memory device. The common row decoder 2 and common column decoder 3 of the dynamic memory device are, for their part, driven externally by a signal designated by "address".

The data which are read from the dynamic memory device or written to the dynamic memory device are buffer-stored in an input buffer 14 and output buffer 15, in order to synchronize the inputting and outputting of the data with external devices.

Figure 3B:
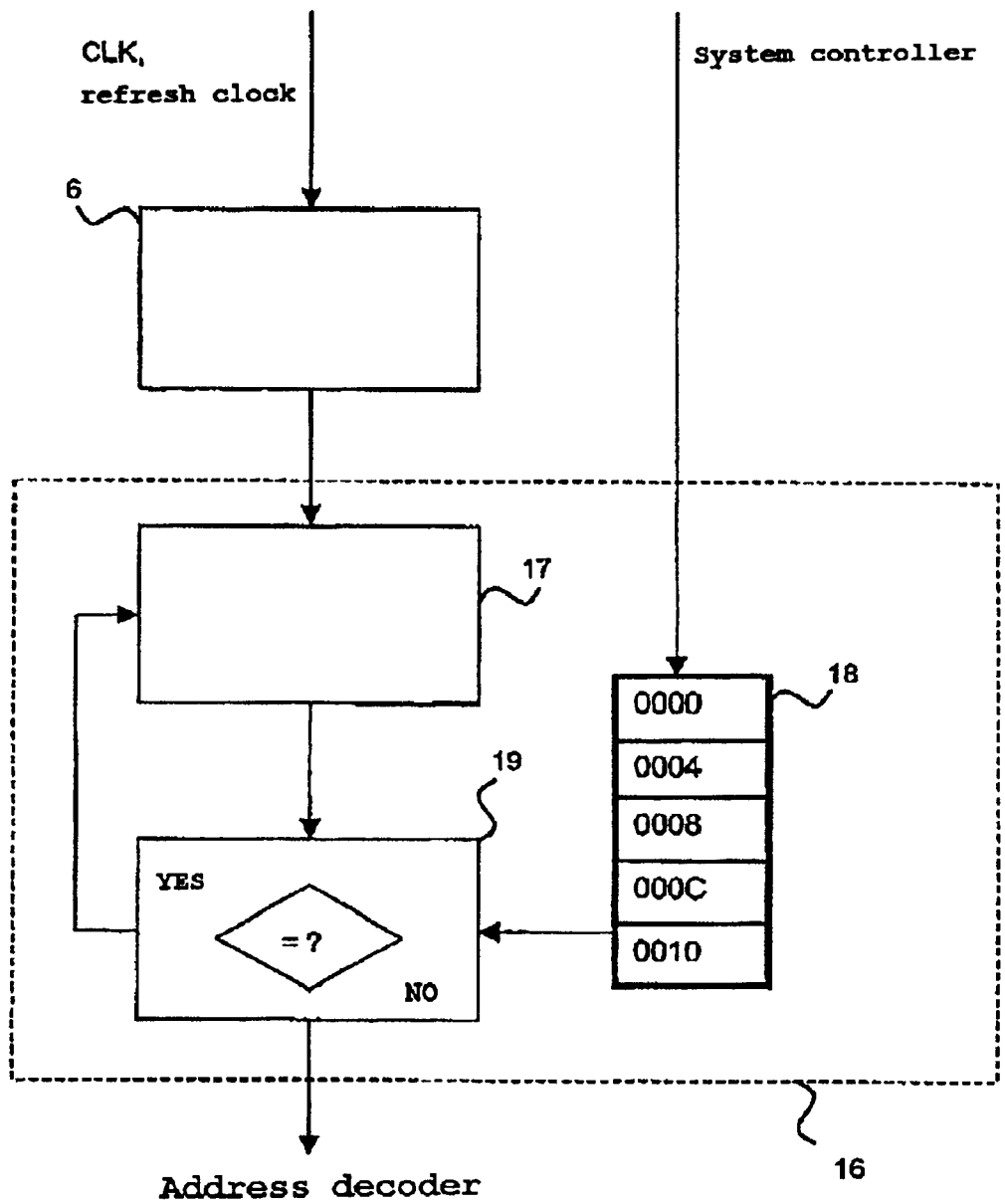

In a selection device 16, a decision is taken as to the memory cells for which a refresh is actually to be carried out. To that end, the selection device 16 comprises, as shown in FIG. 3B, an address generator 17 which cyclically generates memory addresses. This cyclic generation of memory addresses is started by the sequence control device 6, which, for its part, is driven by the system clock and by the refresh time base 8.

The memory address generated by the address generator 17, which memory address may be merely a row address rather than a complete address, is compared with addresses which have been stored in an address register 18 by the external system controller. As an example, the illustration shows five addresses in hexadecimal representation in the address register 18, which addresses contain no data which necessitated a refresh operation.

These, addresses are "forbidden" addresses in the embodiment shown in FIG. 3B. If a comparator 19 ascertains that the memory address generated by the address generator 17 corresponds to an address in the address register 18, then the forwarding of the address to the address decoder 2 and 3 or to the multiplexer 7 is interrupted, and the comparator 19 outputs a signal to the address generator, so that the latter immediately generates a further refresh address. By contrast, if the comparator 19 does not find the memory address generated by the address generator 17 in the address generator 18, then it releases the address, and the corresponding memory cell(s) is (are) subjected to a refresh operation.

Thus, e.g. 8 row blocks in the memory can be masked out by eight masking-out state bits in a register. If a row block is masked out, e.g. every eighth row is no longer activated. This saves almost an eighth of the current in the case of an autorefresh command, and somewhat less than an eighth of the current in the self-refresh. At the start, the system switches off e.g. all eight row blocks, which means a power loss of almost zero. If memory space is required later, the system can provide memory space little by little. The provision of additional memory space is associated with a correspondingly increased current consumption of the system.

It is clear to the person skilled in the art, of course, that the storage of "forbidden" addresses constitutes only a specific embodiment and "permissible" addresses can also equally well be stored. In this case, it is necessary to invert the logic of the comparator 19.

Figure 4:
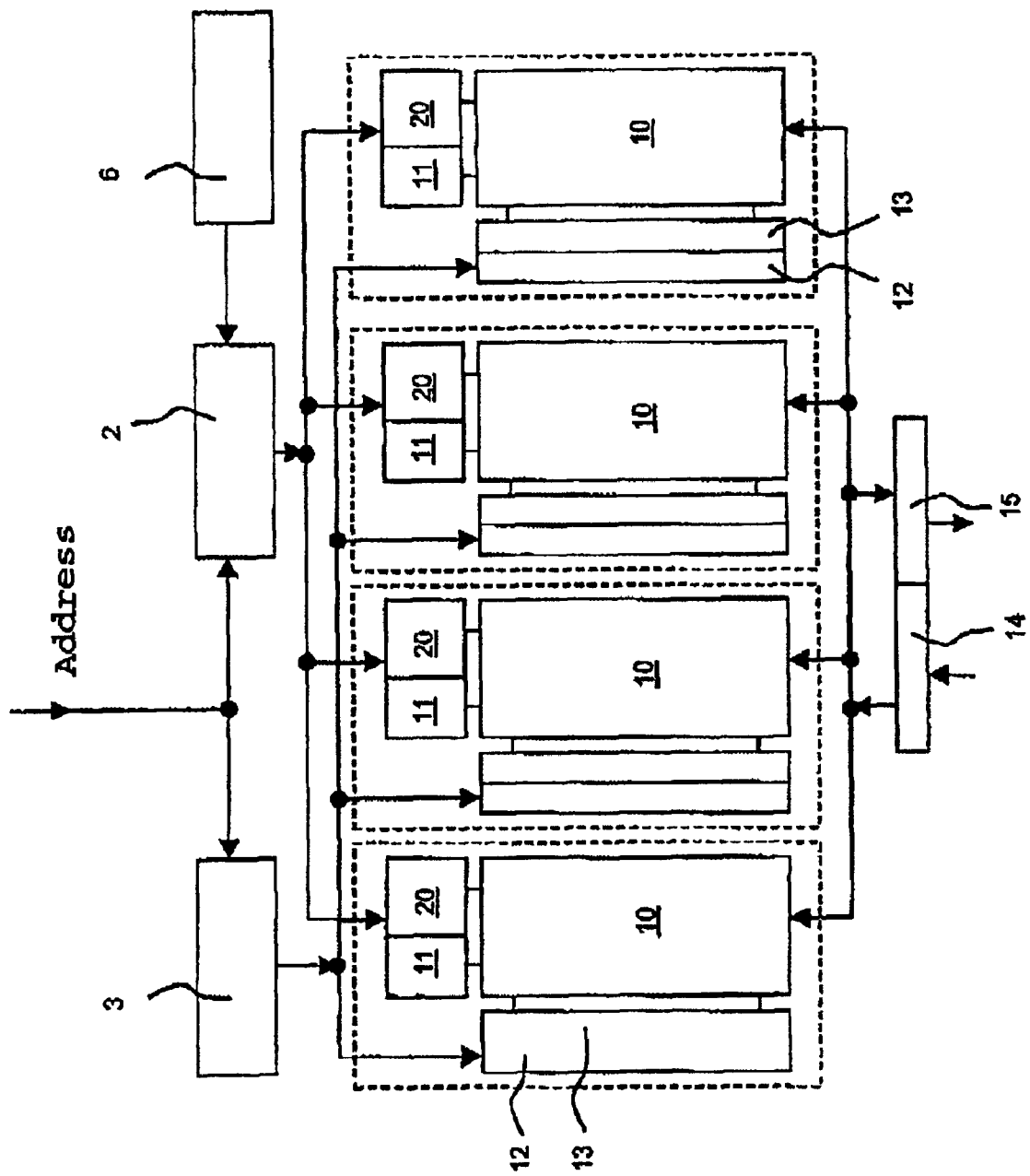
FIG. 4 diagrammatically shows a second embodiment of the invention.

In the embodiment according to FIG. 3A, the selection device is illustrated as part of the sequence control 6. However, this is only one possibility. It is appropriate in particular when refresh operations are carried out row by row and the memory is constructed in a block, as is illustrated in FIG. 1. In the case of memories structured in banks, the selection device can also be distributed between the individual banks. A first embodiment of this type is illustrated in FIG. 4. In the case of this construction, which essentially corresponds to that in FIG. 3, a selection device 20 is provided as part of each row address decoder 11 of a memory bank. This reduces the scope with regard both to the number and to the address width of the memory addresses which have to be stored in the address register 18 by the system controller. The additional outlay through the facility of a comparator and possibly of an address generator for each memory bank is compensated for by the higher speed as well as by the more flexible use of the storage capacity.

Figure 5:
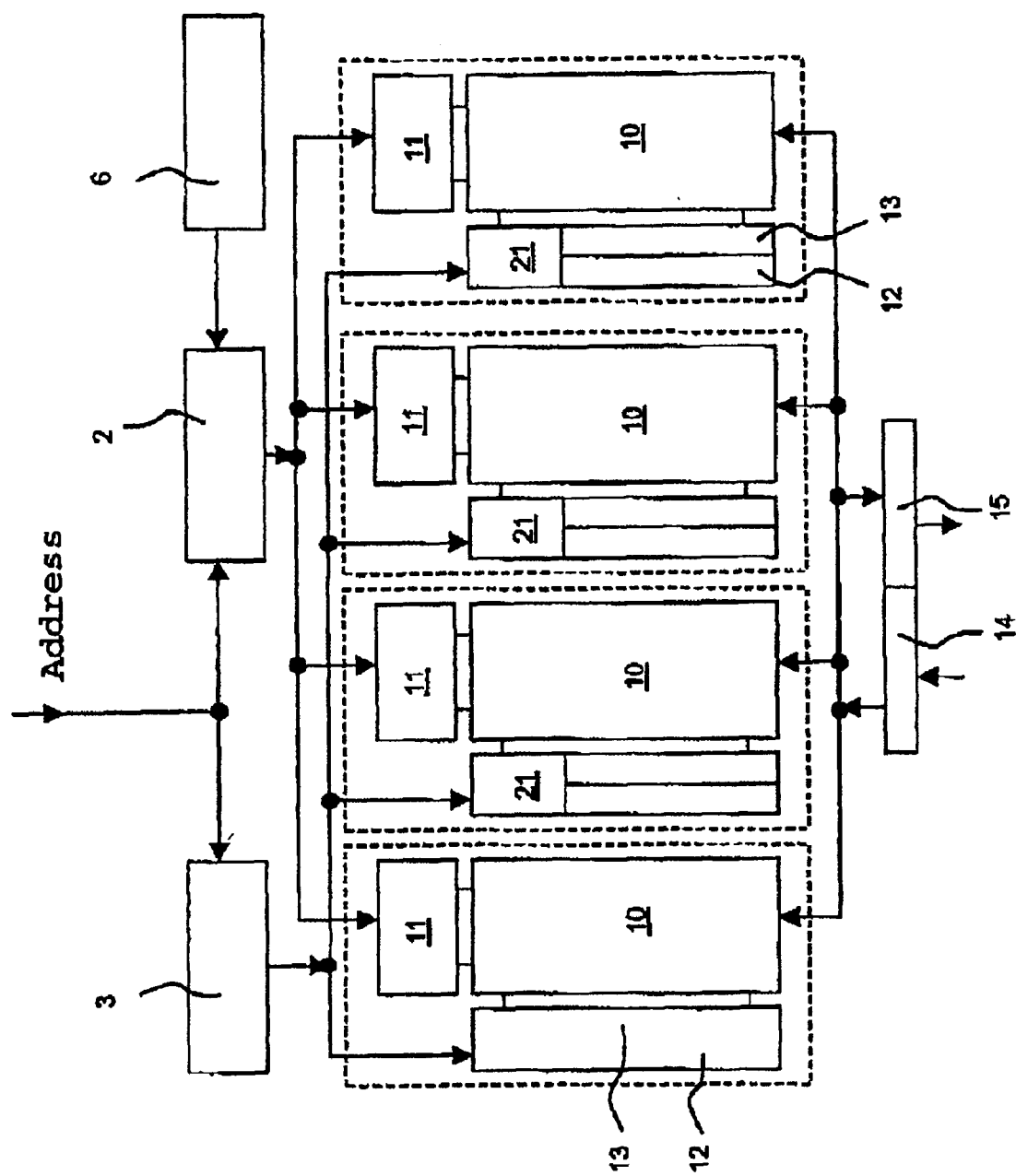
FIG. 5 diagrammatically shows a third embodiment of the invention.

FIG. 5 illustrates an embodiment of the invention in which the selection device is designed for the column-by-column masking-out of memory cells instead of the row-by-row masking-out of memory cells during the refresh. To that end, a selection device 12 is arranged as part of the column address decoder 12 and of the sense amplifier 13 in the memory bank. The refresh operation comprises the processes of reading the memory content from the memory cell and writing the same memory content to the same memory cell. If the selection device 21 is connected to the sense amplifier 13, during the refresh it is possible to prevent the read-out of those memory cells whose address is situated in the address register 18. In other words: if columns are masked out, the sense amplifiers (sense amps) of the memory can be masked out in such a way that they are no longer activated.

However, an access to a specific column whose address is situated in the address register 18 can also equally well be prevented, analogously to the above-described procedure with row-by-row addressing, by the column address decoder 12. In this case, of course, it is column addresses and not row addresses that form the content of the address register 18.

In all the embodiments described and illustrated in drawings, the addresses of memory cells which are not occupied are skipped by the selection device 16, 20, 21 during the cyclic generation of the plurality of refresh addresses. This is done independently of the type of refresh operations, of which, in particular, the following three can be used:

The refresh can be carried out as a "burst refresh". In this case, after every 8 ms, normal operation is interrupted and a refresh is carried out for all the memory cells (which has the consequence, however, that the memory is blocked for 100 μs).

The refresh can be uniformly distributed ("cycle stealing"), i.e. the counter reading of the refresh counter is incremented by one every 8 μs, so that all the row addresses have been called up once after 1024×8 μs~8 ms. To that end, the processor is stopped every 8 μs for one cycle and a refresh step is executed. The refresh time base 8 divides down the clock CLK in such a way that a refresh command is passed to the sequence control 6 every 8 μs. The counter reading of the refresh counter 9 [lacuna] output via the multiplexer 7 to the memory 1 and the RAS signal temporarily set to one. Afterward, the counter reading is incremented by one. During the refresh cycle the processor is stopped by means of a WAIT signal.

Finally, the refresh can be carried out in the "hidden refresh". In this case, the refresh steps are executed precisely when the processor (not illustrated) is not accessing the memory.

| | Reference symbols |
|---|---|
| 1 | Memory cell matrix |
| 2 | Row decoder |
| 3 | Column decoder |
| 4 | Row address latch |

| | -continued |
|---|---|
| | Reference symbols |
| 5 | Column address latch |
| 6 | Sequence control device |
| 7 | Multiplexer |
| 8 | Refresh time base |
| 9 | Refresh counter |
| 10 | Memory area in memory bank |
| 11 | Row address decoder of the memory bank |
| 12 | Column address decoder of the memory bank |
| 13 | Sensor amplifier in memory bank |
| 14 | Input buffer of dynamic memory device |
| 15 | Output buffer of dynamic memory device |
| 16 | Refresh address selection device |
| 17 | Refresh address generator |
| 18 | Address register with "forbidden" row addresses |
| 19 | Comparator |
| 20 | Register with "forbidden" row addresses in row address decoder of the memory bank |
| 21 | Register with "forbidden" column addresses in column address decoder of the memory bank |

What is claimed is:
1. Dynamic memory device having:
(a) at least one memory matrix having a plurality of memory cells arranged in rows and columns, the memory cells in a row being connected by in each case one of a plurality of word lines and the memory cells in a column being connected by in each case one of a plurality of bit lines,
(b) at least one sense amplifier for reading data from the memory cells via the plurality of bit lines,
(c) at least one row address decoder and at least one column address decoder for generating a memory-internal address in a manner dependent on a memory-external address signal,
(d) a sequence control device for cyclically generating refresh addresses for carrying out a refresh operation of the memory cells, wherein a selection device for selectively skipping addresses of memory cells which are not occupied, during the cyclic generation of the plurality of refresh addresses,
wherein the selection device comprises:
  (i) an address generator for generating a refresh address,
  (ii) an address register, in which unoccupied memory addresses are stored, and
  (iii) a logic circuit, which outputs a masking-out signal when an address generated by the address generator corresponds to an address stored in the address register, so that the address generator directly generates a further refresh address.

2. Dynamic memory device according to claim 1, wherein row addresses are stored in the address register.

3. Dynamic memory device according to claim 1, wherein column addresses are stored in the address register.

4. Dynamic memory device according to claim 1, in which the memory cells are distributed between a plurality of memory banks, each memory bank comprising a sense amplifier for reading data from the memory cells via the plurality of bit lines and a row address decoder and a column address decoder for generating a memory-internal address in a manner dependent on a memory-external address signal, wherein the selection device is distributed between the plurality of memory banks, for selectively skipping addresses of memory cells in the respective memory bank which are not occupied, during the cyclic generation of the plurality of refresh addresses.

5. Method for refreshing a memory content of a dynamic memory device having at least one memory matrix having a plurality of memory cells arranged in rows and columns, the memory cells in a row being connected by in each case one of a plurality of word lines and the memory cells in a column being connected by in each case one of a plurality of bit lines, the method comprising:

(a) reading data from the memory cells via the plurality of bit lines at least one sense amplifier, (b) generating a memory-internal address in a manner dependent on a memory-external address signal via at least one row address decoder and at least one column address decoder, (c) cyclically generating refresh addresses for carrying out a refresh operation of the memory cells via a sequence control device, wherein selective skipping of addresses of memory cells which are not occupied, during the cyclic generation of the plurality of refresh addresses, by a selection device, (d) storing unoccupied memory addresses in an address register in the selection device, (e) generating a refresh address via an address generator, and (f) when an address generated by the address generator corresponds to an address stored in the address register, outputting a masking-out signal via a logic circuit such that the address generator directly generates a further refresh address.

6. Method according to claim 5, comprising storing row addresses in the address register.

7. Method according to claim 5, comprising storing column addresses in the address register.

8. Method according to claim 5, comprising effecting the refresh operations of the memory cells in a burst mode.

9. Method according to claim 5, comprising effecting the refresh operations of the memory cells in a cycle stealing mode.

10. Method according to claim 5, comprising effecting the refresh operations of the memory cells in a hidden refresh mode.

* * * * *